(12) United States Patent
Hung

(10) Patent No.: US 9,563,117 B2
(45) Date of Patent: Feb. 7, 2017

(54) MASK ASSEMBLY AND PHOTOLITHOGRAPHY PROCESS USING THE SAME

(71) Applicant: Winbond Electronics Corp., Taichung (TW)

(72) Inventor: Yung-Wen Hung, Kaohsiung (TW)

(73) Assignee: Winbond Electronics Corp., Taichung (TW)

( * ) Notice: Subject to any disclaimer, the term of this patent is extended or adjusted under 35 U.S.C. 154(b) by 71 days.

(21) Appl. No.: 14/793,728

(22) Filed: Jul. 7, 2015

(65) Prior Publication Data

US 2016/0299418 A1 Oct. 13, 2016

(30) Foreign Application Priority Data

Apr. 13, 2015 (CN) .......................... 2015 1 0170604

(51) Int. Cl.
*G03F 1/38* (2012.01)
*G03F 7/20* (2006.01)

(52) U.S. Cl.
CPC .. *G03F 1/38* (2013.01); *G03F 7/20* (2013.01)

(58) Field of Classification Search
USPC .............................................................. 430/5
See application file for complete search history.

(56) References Cited

U.S. PATENT DOCUMENTS

| 2010/0062674 A1* | 3/2010 | Muraki | H01J 9/025 445/46 |
| 2013/0280645 A1* | 10/2013 | Kuo | G03F 7/203 430/5 |

FOREIGN PATENT DOCUMENTS

| TW | 201500840 | 1/2015 |
| WO | 2014111098 | 7/2014 |

OTHER PUBLICATIONS

"Office Action of Taiwan Counterpart Application", issued on Oct. 26, 2016, p. 1-p. 5.

* cited by examiner

*Primary Examiner* — Stephen Rosasco
(74) *Attorney, Agent, or Firm* — Jianq Chyun IP Office

(57) ABSTRACT

A mask assembly including a first mask and a second mask is provided. The first mask includes a plurality of first main features parallel to each other, a plurality of first sub-resolution assistant features (SRAFs) and a plurality of second SRAFs. The second SRAFs are separately disposed at one side of the first main features. The first SRAFs are separately disposed between the first main features and the second SRAFs. An extension direction of the first main features is parallel to an extension direction of the second SRAFs. The second mask includes a plurality of second main features parallel to each other. When the first mask and the second mask are placed at a predetermined position above a negative-type development photoresist layer for performing exposure respectively, the second main features intersect with the first main features and the second main features overlap with the first SRAFs.

18 Claims, 8 Drawing Sheets

M1+M2

| Comparative Example 3 (best focus) | | Comparative Example 4 (best focus) | | Second embodiment (best focus) | |
|---|---|---|---|---|---|
| First and second masks having second and fourth SRAFs only | Patterned photoresist layer | First and second masks having first and third SRAFs only | Patterned photoresist layer | First and second masks of the second embodiment | Patterned photoresist layer |

FIG. 6A

MASK ASSEMBLY AND PHOTOLITHOGRAPHY PROCESS USING THE SAME

CROSS-REFERENCE TO RELATED APPLICATION

This application claims the priority benefit of China application serial no. 201510170604.5, filed on Apr. 13, 2015. The entirety of the above-mentioned patent application is hereby incorporated by reference herein and made a part of this specification.

BACKGROUND OF THE INVENTION

Field of the Invention

The invention relates to a mask, and in particular, a mask assembly for Double Exposure (DE).

Description of Related Art

The photolithography process is a key process in the whole semiconductor manufacturing process. How to further reduce the critical dimension is a challenge that all researchers and developers will constantly encounter. In the challenge of pattern shrinkage, various methods have been proposed one after another, e.g., Double Exposure (DE), Litho-Etch Litho-Etch (LELE), Extreme Ultraviolet Lithography (EUVL), Self-Alignment Double Patterning (SADP), Negative-Tone Development (NTD), and Directed Self-Assembly (DSA). Currently, the light source power necessary for Extreme Ultraviolet Lithography has not yet been advanced enough for mass production, and the materials necessary for Directed Self-Assembly are still at the stage of development. Therefore, current semiconductor manufacturing processes mostly rely on the technology of Multi Pattering to reduce the critical dimension. For example, process technology combining Double Exposure and Negative-Tone Development effectively reduces the dimension of a contact hole.

In addition to pattern shrinkage, enhancement of the process window is another key factor in the photolithography process for determining whether mass production can be introduced. Generally speaking, an excellent mask feature design has a definite contribution to the enhancement of the process window. Based on the above, in the process technology combining Double Exposure and Negative-Tone Development, how to enhance the process window through adequate mask feature designs is currently one of the issues that researchers and developers seek to resolve.

SUMMARY OF THE INVENTION

The invention provides a mask assembly for enhancing a process window of a photolithography process.

The invention provides a photolithography process having an excellent process window.

The mask assembly of the invention is used for performing double exposure on a negative-type development photoresist layer. The mask assembly includes a first mask and a second mask. The first mask includes a plurality of first main features parallel to each other, a plurality of first sub-resolution assistant features (SRAFs), and a plurality of second sub-resolution assistant features. The second sub-resolution assistant features are disposed separately from each other at one side of the first main features. The first sub-resolution assistant features are disposed separately from each other between the first main features and the second sub-resolution assistant features. An extension direction of the first main features is parallel to an extension direction of the second sub-resolution assistant features. The second mask includes a plurality of second main features parallel to each other. When the first mask and the second mask are placed at a predetermined position above the negative-type development photoresist layer for performing exposure respectively, the second main features intersect with the first main features, and the second main features overlap with the first sub-resolution assistant features.

The photolithography process of the invention includes the following steps. First, the above-described mask assembly is provided. Next, exposure is performed twice on the negative-type development photoresist layer respectively by using the first mask and the second mask as a mask. Afterwards, development is performed on the negative-type development photoresist layer.

In one embodiment of the invention, when the first mask and the second mask are placed at the predetermined position for performing exposure respectively, the extension direction of the first main features is vertical to an extension direction of the second main features.

In one embodiment of the invention, when the first mask and the second mask are placed at the predetermined position for performing exposure respectively, an extension direction of the first sub-resolution assistant features is parallel to the extension direction of the second main features.

In one embodiment of the invention, an arrangement interval of the first sub-resolution assistant features is identical to an arrangement interval of the second main features.

In one embodiment of the invention, when the first mask and the second mask are placed at the predetermined position for performing exposure respectively, the second sub-resolution assistant features do not overlap with the first main features and the second main features.

In one embodiment of the invention, the second mask further includes a plurality of third sub-resolution assistant features and a plurality of fourth sub-resolution assistant features. The fourth sub-resolution assistant features are disposed separately from each other at one side of the second main features. The third sub-resolution assistant features are disposed separately from each other between the second main features and the fourth sub-resolution assistant features. In addition, the extension direction of the second main features is parallel to an extension direction of the fourth sub-resolution assistant features.

In one embodiment of the invention, when the first mask and the second mask are placed at the predetermined position for performing exposure respectively, an extension direction of the third sub-resolution assistant features is parallel to the extension direction of the first main features.

In one embodiment of the invention, an arrangement interval of the third sub-resolution assistant features is identical to an arrangement interval of the first main features.

In one embodiment of the invention, when the first mask and the second mask are placed at the predetermined position for performing exposure respectively, each of the third sub-resolution assistant features is disposed between two adjacent first main features, and the third sub-resolution assistant features do not overlap with the first main features.

In one embodiment of the invention, when the first mask and the second mask are placed at the predetermined position for performing exposure respectively, the fourth sub-resolution assistant features do not overlap with the first main features and the second main features.

In light of the above, since the invention adopts designs of the first sub-resolution assistant features and the second sub-resolution assistant features, the invention is capable of improving the process window of the photolithography process.

To provide a further understanding of the aforementioned and other features and advantages of the invention, exemplary embodiments, together with the reference drawings, are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 6A and FIG. 6B are schematic views of patterned photoresist layers formed after a negative-type development photoresist layer is exposed and developed by different mask designs.

DESCRIPTION OF THE EMBODIMENTS

First Embodiment

Figure 1:
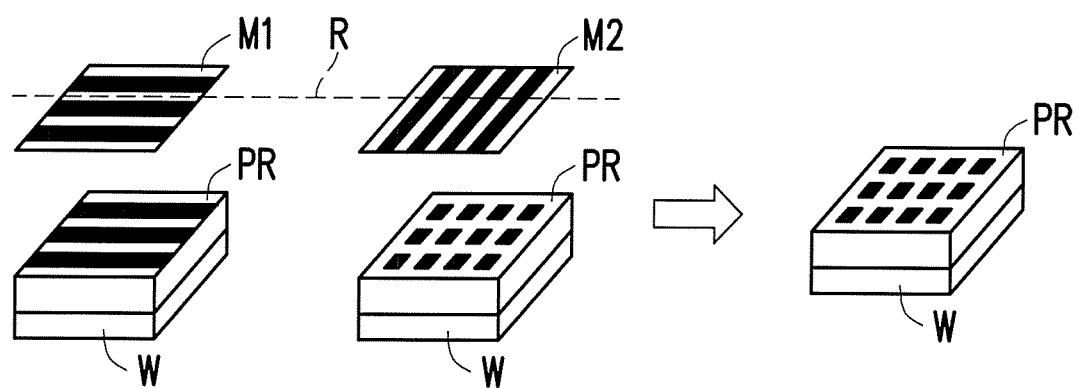
FIG. 1 is a schematic view of a photolithography process according to the first embodiment of the invention.

FIG. 1 is a schematic view of a photolithography process according to the first embodiment of the invention. Referring to FIG. 1, the photolithography process of the present embodiment includes the following steps. First, a mask assembly including a first mask M1 and a second mask M2 is provided. Next, a negative-type development photoresist layer PR is exposed twice respectively by using the first mask M1 and the second mask M2 as a mask. Here, the present embodiment first uses the first mask M1 as a mask to expose the negative-type development photoresist layer PR for a first time and then uses the second mask M2 as a mask to expose the negative-type development photoresist layer PR for a second time. Alternatively, the second mask M2 is used as a mask to expose the negative-type development photoresist layer PR for a first time and then the first mask M1 is used as a mask to expose the negative-type development photoresist layer PR for a second time. In other words, the present embodiment does not limit the order of using the first mask M1 and the second mask M2. In the present embodiment, the negative-type development photoresist layer PR is formed on a wafer W or other substrates, for example. Generally, the negative-type development photoresist layer PR covers a conductive or dielectric thin film to be patterned. After multiple exposure is completed, development is performed on the negative-type development photoresist layer PR. The aforementioned development includes negative-tone development, for example.

To retain an excellent exposure resolution at an edge of the mask adopted in the photolithography process and further improve a process window of the photolithography process, the present embodiment adopts sub-resolution assistant features (SRAFs) of a special design on the first mask M1 and the second mask M2. Referring to FIGS. 2A, 2B, and FIGS. 3-4, the following describes the first mask M1 and the second mask M2 in detail.

Figure 2A:
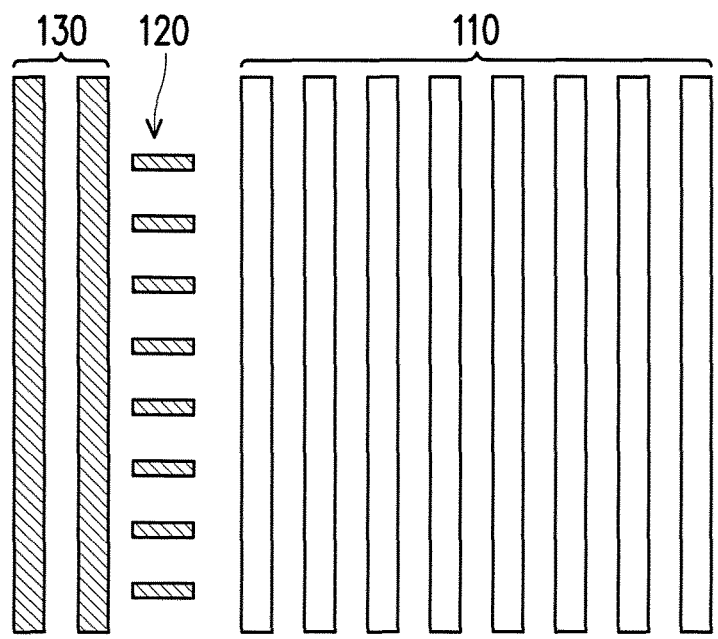
FIG. 2A and FIG. 2B are top views of a first mask and a second mask respectively in the first embodiment.
Figure 2B:
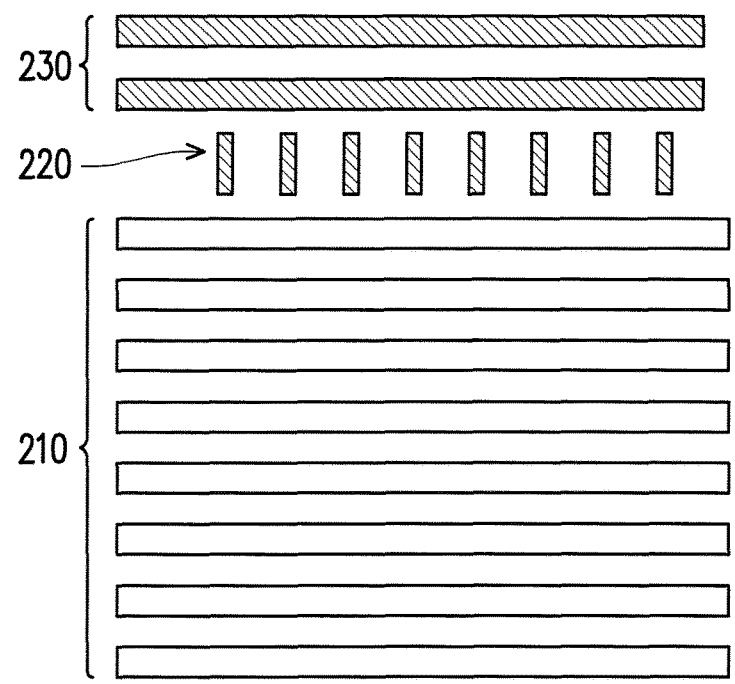
Figure 3:
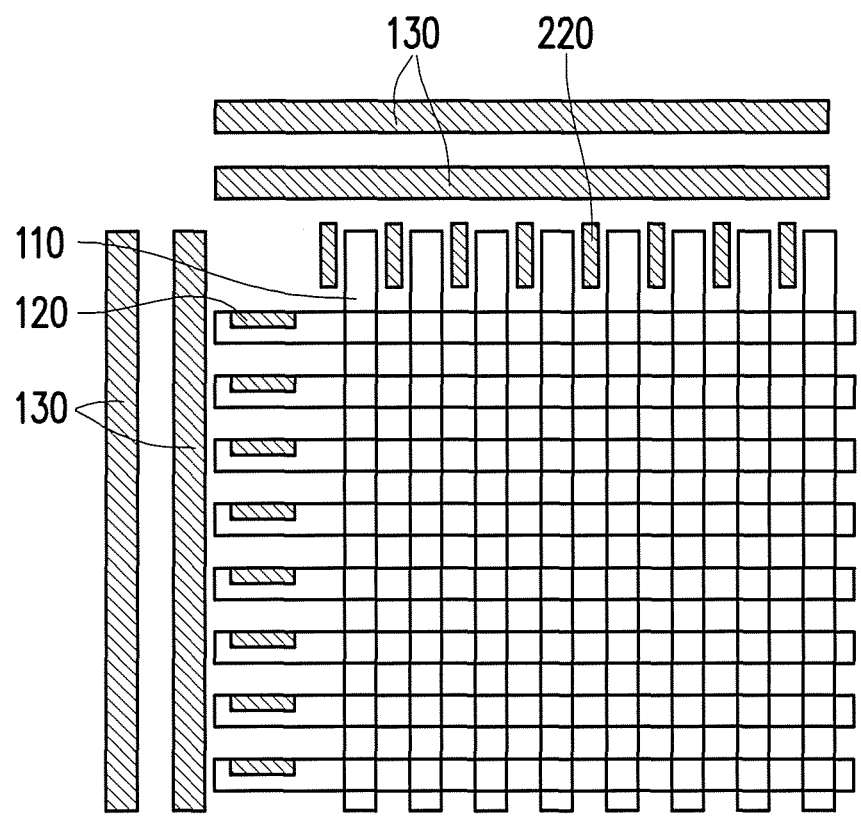
FIG. 3 is a schematic view of a relative relation of the first mask and the second mask of the first embodiment when the first mask and the second mask are placed at a predetermined position above a negative-type development photoresist layer for performing exposure respectively.

FIG. 2A and FIG. 2B are top views of the first mask and the second mask respectively in the first embodiment. FIG. 3 is a schematic view of a relative relation of the first mask and the second mask of the first embodiment when the first mask and the second mask are placed at a predetermined position above the negative-type development photoresist layer for performing exposure respectively.

Referring to FIGS. 2A and 2B, the first mask M1 of the present embodiment includes a plurality of first main features 110 parallel to each other, a plurality of first sub-resolution assistant features 120, and a plurality of second sub-resolution assistant features 130. As shown in FIGS. 2A and 2B, the second sub-resolution assistant features 130 are disposed separately from each other at at least one side of the first main features 110. The first sub-resolution assistant features 120 are disposed separately from each other between the first main features 110 and the second sub-resolution assistant features 130, and an extension direction of the first main features 110 is parallel to an extension direction of the second sub-resolution assistant features 130. For example, the first sub-resolution assistant features 120 and the second sub-resolution assistant features 130 are generally distributed at a periphery of the first main features 110 to reinforce an exposure resolution at an edge of the first mask M1. In addition, the second mask M2 at least includes a plurality of second main features 210 parallel to each other.

Referring to FIGS. 1-3, when the first mask M1 and the second mask M2 are placed at a predetermined position P (illustrated in FIG. 1) above the negative-type development photoresist layer PR for performing exposure respectively, the second main features 210 intersect with the first main features 110, and the second main features 210 may overlap with the first sub-resolution assistant features 120. As shown in FIG. 3, an overlapping area of the first sub-resolution assistant features 120 and the second main features 210 is an area of the first sub-resolution assistant features 120 themselves. In addition, an arrangement interval of the first sub-resolution assistant features 130 is identical to an arrangement interval of the second main features 210.

As shown in FIG. 3, when the first mask M1 and the second mask M2 are placed at the predetermined position P for performing exposure twice, the extension direction of the first main features 110 is vertical to an extension direction of the second main features 210, for example. An extension direction of the first sub-resolution assistant features 120 is parallel to the extension direction of the second main features 210, for example. In addition, the second sub-resolution assistant features 130 do not overlap with the first main features 110 and the second main features 210.

In addition to the second main features 210, the second mask M2 further includes a plurality of third sub-resolution assistant features 220 and a plurality of fourth sub-resolution assistant features 230. The fourth sub-resolution assistant features 230 are disposed separately from each other at one side of the second main features 210. The third sub-resolution assistant features 220 are disposed separately from each other between the second main features 210 and the fourth sub-resolution assistant features 230. In addition, the extension direction of the second main features 210 is parallel to an extension direction of the fourth sub-resolution assistant features 230. For example, the third sub-resolution assistant features 220 and the fourth sub-resolution assistant features 230 are usually distributed at a periphery of the second main features 210 to reinforce an exposure resolution at an edge of the second mask M2.

As shown in FIG. 3, when the first mask M1 and the second mask M2 are placed at the predetermined position P for performing exposure twice, an extension direction of the third sub-resolution assistant features 220 is parallel to the extension direction of the first main features 110. In addition, an arrangement interval of the third sub-resolution assistant features 220 is identical to an arrangement interval of the first main features 110. Each of the third sub-resolution assistant features 220 is disposed between two adjacent first main features 110, and the third sub-resolution assistant features 220 do not overlap with the first main features 110. In addition, the fourth sub-resolution assistant features 230 do not overlap with the first main features 110 and the second main features 210.

In the above-described first embodiment, the simultaneous use of the first sub-resolution assistant features 120 and the second sub-resolution assistant features 130 significantly improves the exposure resolution at the edge of the first mask M1 and the second mask M2, as detailed below with reference to FIG. 4.

Figure 4A:
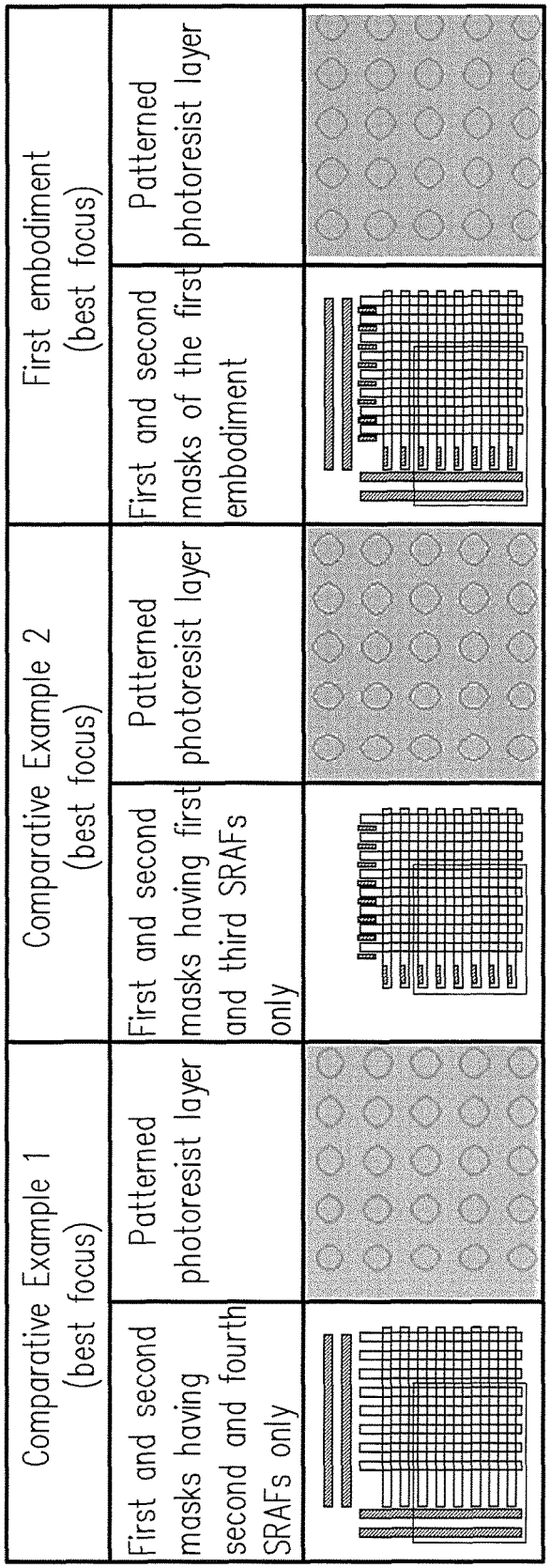
FIG. 4A and FIG. 4B are schematic views of patterned photoresist layers formed after the negative-type development photoresist layer is exposed and developed by different mask designs.
Figure 4B:
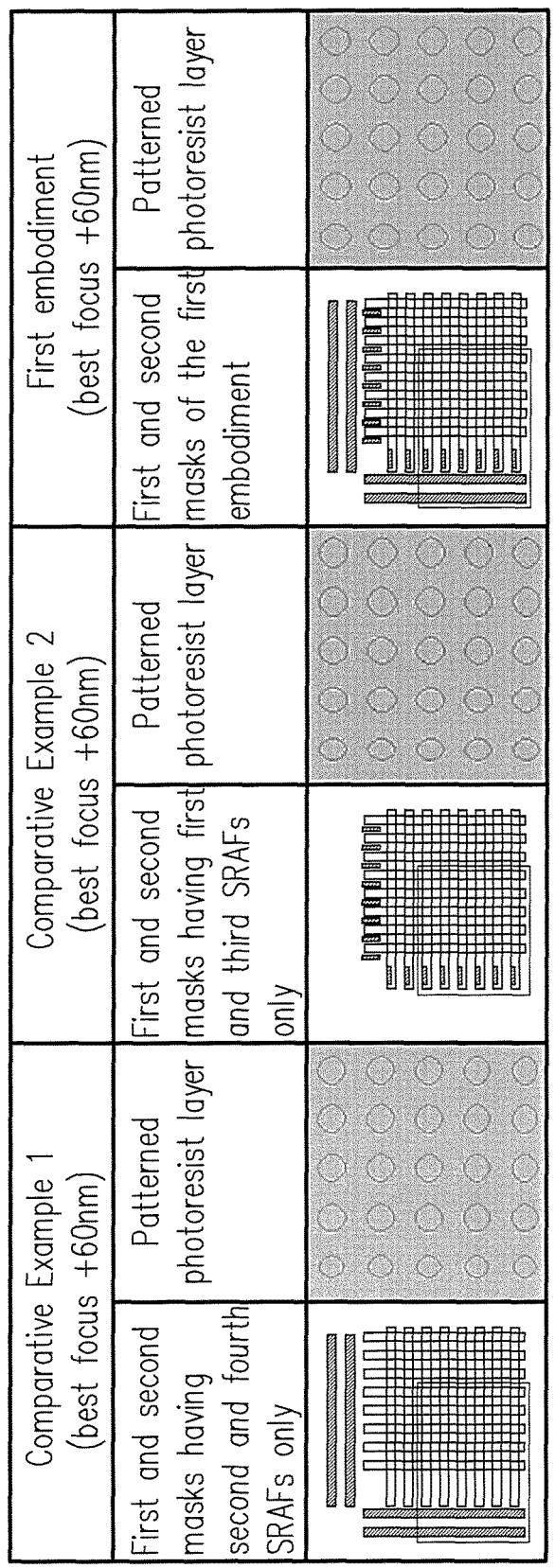

FIG. 4A and FIG. 4B are schematic views of patterned photoresist layers formed after the negative-type development photoresist layer is exposed and developed by different mask designs. Referring to FIGS. 4A and 4B, in the first embodiment, the first mask has the first main features, the first sub-resolution assistant features, and the second sub-resolution assistant features. The second mask has the second main features, the third sub-resolution assistant features, and the fourth sub-resolution assistant features. In Comparative Example 1, a first mask has first main features and second sub-resolution assistant features only, and a second mask has second main features and fourth sub-resolution assistant features only. In Comparative Example 2, a first mask has first main features and first sub-resolution assistant features only, and a second mask has second main features and third sub-resolution assistant features only.

FIGS. 4A and 4B show that in Comparative Examples 1 and 2, a patterned photoresist layer has a poor resolution at a portion corresponding to an edge of the mask (the left edge in the drawings). By contrast, in the first embodiment, because of the designs of the first sub-resolution assistant features, the second sub-resolution assistant features, the third sub-resolution assistant features, and the fourth sub-resolution assistant features, the exposure resolution at the edge of the mask (the left edge in the drawings) is significantly improved.

FIGS. 4A and 4B clearly show that whether at a best focus point or 60 nm off the best focus point, a photolithography process adopting the first mask and the second mask of the present embodiment has an excellent process window.

Second Embodiment

Figure 5:
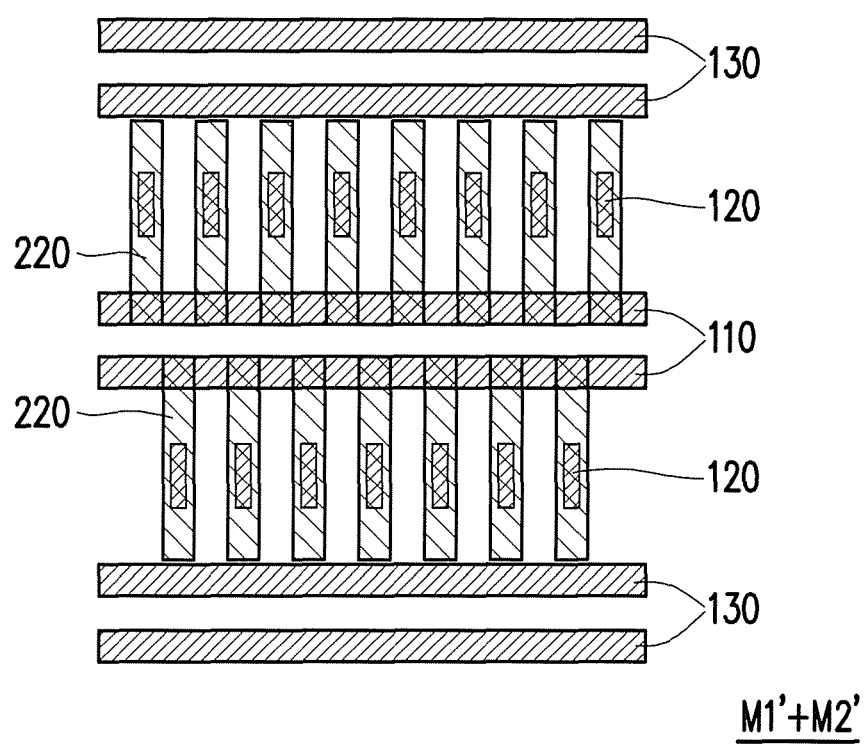
FIG. 5 is a schematic view of a relative relation of the first mask and the second mask of the second embodiment when the first mask and the second mask are placed at a predetermined position above a negative-type development photoresist layer for performing exposure respectively.

FIG. 5 is a schematic view of a relative relation of a first mask and a second mask of the second embodiment when the first mask and the second mask are placed at a predetermined position above a negative-type development photoresist layer for performing exposure respectively. Referring to FIG. 5, the first mask M1' and the second mask M2' of the present embodiment are similar to the first mask M1 and the second mask M2 (illustrated in FIG. 3) of the first embodiment. The major difference between the two lies in that in the present embodiment, an overlapping position of first main features 110 and second main features 210 is different, and the second mask M2' has the second main features 210 only.

Figure 6B:
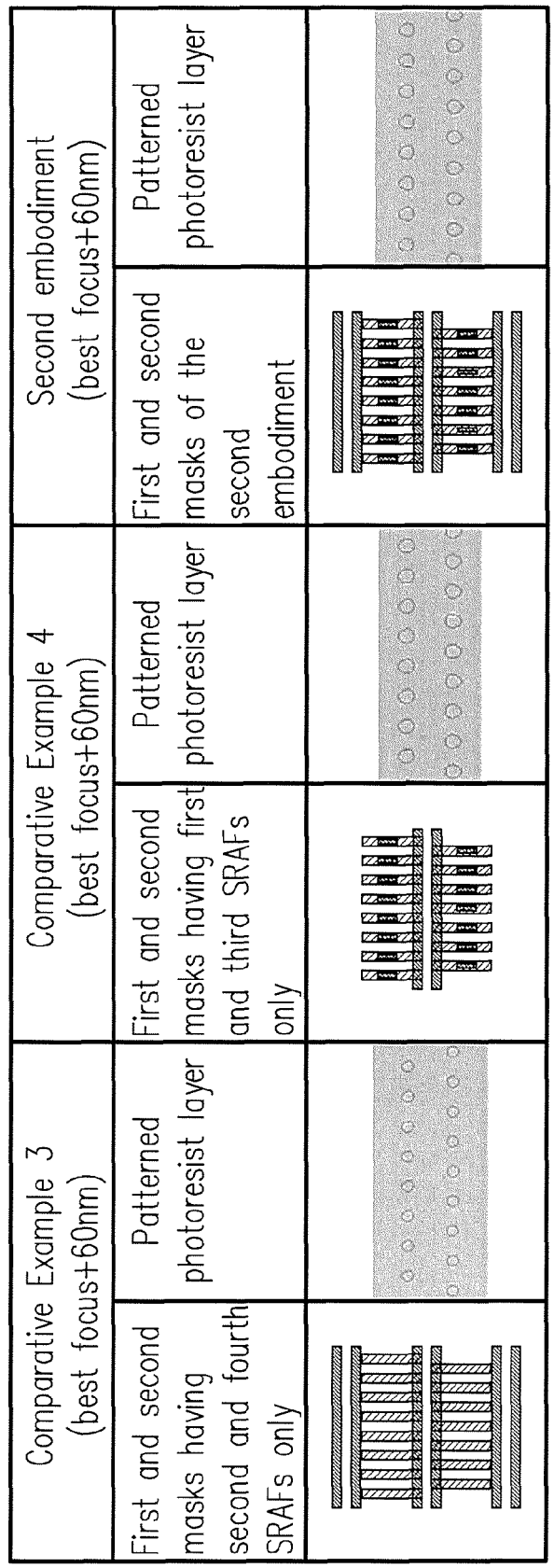

FIG. 6A and FIG. 6B are schematic views of patterned photoresist layers formed after a negative-type development photoresist layer is exposed and developed by different mask designs. Referring to FIGS. 6A and 6B, in the second embodiment, the first mask has the first main features, first sub-resolution assistant features, and second sub-resolution assistant features, while the second mask has the second main features only. In Comparative Example 3, a first mask has first main features and second sub-resolution assistant features only, and a second mask has second main features only. In Comparative Example 4, a first mask has first main features and first sub-resolution assistant features only, and a second mask has second main features only.

FIGS. 6A and 6B show that in Comparative Examples 3 and 4, a patterned photoresist layer has a poor resolution at a portion corresponding to an edge of the mask. By contrast, in the second embodiment, because of the designs of the first sub-resolution assistant features and the second sub-resolution assistant features, the exposure resolution at the edge of the mask is significantly improved.

FIGS. 6A and 6B clearly show that whether at a best focus point or 60 nm off the best focus point, a photolithography process adopting the first mask and the second mask of the present embodiment has an excellent process window.

Note that the invention does not limit the configurations of the first and second main features on the first mask and the second mask. People of ordinary skill in the art can modify the first and second main features according to their actual needs for design.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A mask assembly for performing double exposure on a negative-type development photoresist layer, the mask assembly comprising:
   a first mask comprising a plurality of first main features parallel to each other, a plurality of first sub-resolution assistant features, and a plurality of second sub-resolution assistant features, wherein the second sub-resolution assistant features are disposed separately from each other at one side of the first main features, the first sub-resolution assistant features are disposed separately from each other between the first main features and the second sub-resolution assistant features, and an extension direction of the first main features is parallel to an extension direction of the second sub-resolution assistant features; and
   a second mask comprising a plurality of second main features parallel to each other, wherein the second main features intersect with the first main features, and the second main features overlap with the first sub-resolution assistant features when the first mask and the second mask are placed at a predetermined position above the negative-type development photoresist layer for performing exposure respectively.

2. The mask assembly according to claim 1, wherein the extension direction of the first main features is vertical to an extension direction of the second main features when the first mask and the second mask are placed at the predetermined position for performing exposure respectively.

3. The mask assembly according to claim 1, wherein an extension direction of the first sub-resolution assistant features is parallel to the extension direction of the second main features when the first mask and the second mask are placed at the predetermined position for performing exposure respectively.

4. The mask assembly according to claim 1, wherein an arrangement interval of the first sub-resolution assistant features is identical to an arrangement interval of the second main features.

5. The mask assembly according to claim 1, wherein the second sub-resolution assistant features do not overlap with the first main features and the second main features when the first mask and the second mask are placed at the predetermined position for performing exposure respectively.

6. The mask assembly according to claim 1, wherein the second mask further comprises a plurality of third sub-resolution assistant features and a plurality of fourth sub-resolution assistant features, wherein the fourth sub-resolution assistant features are disposed separately from each other at one side of the second main features, the third sub-resolution assistant features are disposed separately from each other between the second main features and the fourth sub-resolution assistant features, and the extension direction of the second main features is parallel to an extension direction of the fourth sub-resolution assistant features.

7. The mask assembly according to claim 6, wherein an extension direction of the third sub-resolution assistant features is parallel to the extension direction of the first main features when the first mask and the second mask are placed at the predetermined position for performing exposure respectively.

8. The mask assembly according to claim 6, wherein an arrangement interval of the third sub-resolution assistant features is identical to an arrangement interval of the first main features.

9. The mask assembly according to claim 6, wherein each of the third sub-resolution assistant features is disposed between two adjacent first main features, and the third sub-resolution assistant features do not overlap with the first main features when the first mask and the second mask are placed at the predetermined position for performing exposure respectively.

10. The mask assembly according to claim 6, wherein the fourth sub-resolution assistant features do not overlap with the first main features and the second main features when the first mask and the second mask are placed at the predetermined position for performing exposure respectively.

11. A photolithography process comprising:
providing the mask assembly according to claim 1;
exposing the negative-type photoresist layer twice respectively with the first mask and the second mask as a mask; and
performing development on the negative-type photoresist layer.

12. The photolithography process according to claim 11, wherein the extension direction of the first main features is vertical to the extension direction of the second main features when the first mask and the second mask are placed at the predetermined position for performing exposure respectively.

13. The photolithography process according to claim 11, wherein the extension direction of the first sub-resolution assistant features is parallel to the extension direction of the second main features when the first mask and the second mask are placed at the predetermined position for performing exposure respectively.

14. The photolithography process according to claim 11, wherein the arrangement interval of the first sub-resolution assistant features is identical to the arrangement interval of the second main features.

15. The photolithography process according to claim 11, wherein the second mask further comprises a plurality of third sub-resolution assistant features and a plurality of fourth sub-resolution assistant features, wherein the fourth sub-resolution assistant features are disposed separately from each other at one side of the second main features, the third sub-resolution assistant features are disposed separately from each other between the second main features and the fourth sub-resolution assistant features, and the extension direction of the second main features is parallel to an extension direction of the fourth sub-resolution assistant features.

16. The photolithography process according to claim 15, wherein an extension direction of the third sub-resolution assistant features is parallel to the extension direction of the first main features when the first mask and the second mask are placed at the predetermined position for performing exposure respectively.

17. The photolithography process according to claim 15, wherein an arrangement interval of the third sub-resolution assistant features is identical to an arrangement interval of the first main features.

18. The photolithography process according to claim 15, wherein the development comprises negative-tone development.

* * * * *